United States Patent [19]

Affolter et al.

[11] 3,973,226

[45] Aug. 3, 1976

[54] FILTER FOR ELECTROMAGNETIC WAVES

[75] Inventors: Peter Affolter, Unterehrendinge; Alfred Kach, Untersiggenthal, both of Switzerland

[73] Assignee: Patelhold Patentverwertungs-und Elektro-Holding AG, Glarus, Switzerland

[22] Filed: July 12, 1974

[21] Appl. No.: 488,172

[30] Foreign Application Priority Data

July 19, 1973 Switzerland........................ 10546/73

[52] U.S. Cl. ............................ 333/73 R; 333/73 W; 333/83 R

[51] Int. Cl.[2] ........................ H01P 1/20; H01P 7/06; H03H 7/10

[58] Field of Search.............. 333/73 R, 73 W, 73 S, 333/83 R, 98 R, 82 R, 82 B, 95 R, 84 R

[56] References Cited

UNITED STATES PATENTS 3,475,642 10/1969 Karp et al.................... 333/83 R X
3,840,828 10/1974 Linn et al.......................... 333/73 S

OTHER PUBLICATIONS

Cohn–Microwave Bandpass Filters Containing High–Q Dielectric Resonators in IEEE Trans. on Microwave Theory and Techniques, vol. MTT16, No. 4, Apr. 1968, pp. 218–227.

*Primary Examiner*—Saxfield Chatmon, Jr.
*Assistant Examiner*—Marvin Nussbaum
*Attorney, Agent, or Firm*—Frank L. Durr; Orville N. Greene

[57] ABSTRACT

A plural circuit filter for electromagnetic waves, especially microwaves, of the type which comprises dielectric resonators, is provided wherein dielectric resonator disks or washers are positioned in a tubular metallic housing acting as a shield, the resonator disks being positioned centrally of the housing tube with the axes of the disks extending perpendicularly to the axis of the tube and the separate resonator disks being separated in the housing by apertured partitions which partly determine the coupling coefficient between adjacent circuits.

36 Claims, 7 Drawing Figures

FILTER FOR ELECTROMAGNETIC WAVES

The invention concerns a filter for electromagnetic waves with shielded dielectric resonators.

Dielectric resonators, viz. materials which show a low angle of losses with a high dielectric constant, e.g., titanium dioxide (rutile, $TiO_2$, $\epsilon_r \approx 90$,tan $\delta \approx 3.10^{-4}$) can, as is well-known, aid in the producing of smaller filters. According to theoretical investigations of applicants on spherical models, one obtains optimum Q-values for such resonators only when the resonator is shielded metallically, so that between the shield and the dielectric body, there must be a certain intermediate space all around the body. As a rule, this means that the width of the shield will be about twice the largest measurements of the resonator. The resonator, therefor, must be supported and mechanically fixed with respect to the shield by means of insulating material. As long as the dielectric constant of the supporting material is small relative to that of the resonator, the mounting has no substantial influence on the electrical behavior of the resonator.

However, the widths of the shields have certain upper limits. In order to achieve optimum stopband attenuation with broad frequency spacing in the filters amongst other things, the direct field penetration through the screening tube (between input and output) must be kept as small as possible, i.e., its lowest possible waveguide cut-off frequency, in the case of round tubes that of the $TE_{11}$mode, should be reasonably above the highest pass frequency of the filter said demands: diameter of the shield about twice as great as the greatest width of the dielectric resonator, the wave-guide cut-off frequency of the shield by a definite factor higher than the filter transmission frequency, leads to a formula for the smallest value of $\epsilon_r$ of resonator material by which the dielectric filter with a shielded resonator can still be significantly realized. For example, it follows, that for a disk form of resonator in a round shielding tube, when the lowest permissible value for both of said relations (diameter, frequency) is fixed at 1.8, the relative dielectric coefficient of the resonator material must amount to at least 40.

In practical cases, one needs filter curves, which in a larger surrounding of the transmission ranges, show no penetration losses. Such interfering resonances are, e.g., possible as a result of anisotropy in the resonator material as well as through the oscillating modes. The suppression or avoidance of such secondary resonances is in the first place a question of resonator shape and in the type of oscillation stimulated. With reference to oscillation types, the fundamental mode of the resonator will be stimulated advantageously, since, as a rule, this one shows the greatest interval to a higher characteristic resonance. Also, the coupling is simpler than for a higher resonance. With the above cited geometric relation between resonator and shield, as the indicated calculation of applicants on the sphere model has given, the lowest mode is always a TE- (or H-) type, characterized through a circular E- field and a toroidal H- field.

By further experimental investigations conducted by applicants, it has been shown, among other things, that in a certain measure, every ceramic is anisotropic in spite of its polycrystalline structure. Consequently, there can occur a resonance splitting into two or three frequencies, even when the three orthogonal axes of a resonator form have the identical measurements. Such resonator forms (e.g., spheres, cubes), are therefor unsuited for filter purposes. One must rather take the opposite course and choose a resonator shape, in which at least the length, decisive for the fundamental frequency, has the greatest possible difference from the other two measurements, so that the associated natural frequency shows sufficient difference from those corresponding to other lengths. A possible anisotropy in resonator material, which has the same effect as if the actual lengths in the isotropic body would deviate only slightly from the theoretical value, has then only an (inferior) influence on the resonant frequency, but can no more produce a resonance splitting. A resonator shape, which according to experimental knowledge (and literature information) will fulfill these conditions exceptionally well, is the dielectric disk. The lowest mode is the $TE_{011}$- (or $H_{011}^{-}$) - wave (circular E- field, toroidal shaped H- field). For optimal interval between the next higher resonance and the fundamental resonance (about a factor of 1.4), the proportion of washer thickness to washer radius, must amount to about 0.8 (see (1) page 219, see literature index at the end of the description). The numbers (1) to (5) in parentheses used hereinbelow, refer to said literature index.

The resonance behavior of the dielectric disk has been first investigated theoretically on a free oscillating disk i.e. without shielding (2). Subsequently, different microwave filters were built and tested with such resonators enclosed in a shielding filled all around with air space (3)(4)(5). In the arrangements which are referred to here, the diameter of the shield, purely emperical, is made, without exception, about twice as great as the diameter of the disk. From the said calculation on the spherical models, the results indeed show that the geometric proportions for resonance behavior of free oscillating dielectric resonators can be easily carried over to the case with shielding.

Further essential problems of dielectric filters are the insulating supports of the dielectric disks in relation to the shielding, the kind of tuning of the individual resonators, the disposition of the in- and out-put coupling to the filter supply line, the realization of the intermediate cross-coupling as well as the incorporation of the filters, e.g. into the connections of strip line technique.

Relative to the resonator support and tuning, a concrete embodiment in (4) is described with reference to an example of a five circuit microwave filter. The disk formed $TiO_2$ resonators are arranged in the shielding tube at predetermined distances parallel to the cross-sectional plane, wherein a self-supporting insulating tube mounted at both ends, serves to support the resonating disks. For the purpose of tuning, each of the disks includes a radial blind hole extending into the center into which are introduced from the outside, through the shield, ceramic pegs made of $TiO_2$ material. The mechanical connection of the tuning pegs with the shield housing is effected through metallic threaded sockets, in which the pegs are cemented. The balance of the intercircuit coupling is dealt with by enlarging the resonator spacings, symmetrically, with respect to the middle filter. The inferior rigidity of the resonator mounting is detrimental, the fixing of the tuning cores over metal sockets produces, from experience, spurious resonance, the increasing resonator distances with respect to the middle filter, leads to undesired total length of filters, the change of position of the filters to another frequency range necessitates a change in overall length.

With another arrangement (two circuit filter, see (2) No. 2 FIG. 4-1, page 34) with which the disks lie in a shield tube in the plane of the diameter-long-axis, the tuning is obtained by means of metal screws, directed radially through the shield tube towards the center of the resonator disks. Screw and dielectric resonator develop a series resonance shortly before contact, which makes the tuning process excessively critical. Besides, the tuning screw effects a significant diminishing of the circuit quality.

Also, with the two circuit filter of the arrangement after (5), the rutile disk lies in the diameter-long-axis plane of the shielding tube. With reference to the resonator mounting and tuning, statements are made for only a one circuit filter: supports of resonators in a rounded "Styropor" disk, tuning by means of metal screw which is screwed in the direction of the cylinder axis toward the little disk. The filling of the total shielding tube cross-section with the insulating material diminishes there the lowest wave guide cut-off frequency and therefore the stopband attenuation with broad frequency spacing, but the drawbacks of the resonator tuning are the same as in (2).

With the arrangements in question, the resonator coupling results partly with the coupling loop (2), (3), partly through coupling straps of open-ended design guided along the periphery of the resonator disks (4). With the embodiment according to (5) the rutile disks are arranged (among other things) peripheral at current antinodes of open-ended quarter wave conductor lines.

This invention is based on the problem of making a dielectric filter, preferably for microwaves, which has a compact structure, can be tuned in a simple way or throughout a certain range, contains precise adjustable elements for intercircuit coupling, has simple coupling to feed lines and is compatible with strip line or hybrid technics. The filter curve shall show no spurious resonances or attenuation dips throughout a wide range of the pass band. The filter shall be simple to manufacture and have properties which are relatively easy to reproduce. Advantageously, the shape of the disk (thickness ≈ radius) employed as resonator is taken as a basis.

The invention is characterized in that between the filter circuits, shielded by a tubular filter housing, mechanical elements are provided for diminishing the coupling coefficient.

Further features and improvements of the invention will be apparent from the claims as well as from the following description when read in connection with the drawings.

The filter structures described below are based on different embodiments which have resulted from theoretical investigations on the spherical models. Accordingly, a metallic shielding of the dielectric resonators has practically no influence on the resonant frequency thereof, when the width of the shielding tube is made at least about twice as great as the largest measurement of the dielectric body. The fundamental resonance therefor corresponds constantly to the TE- basic mode (circular E-field, toroidal H- field), furthermore, the no load efficiency corresponds practically to the ctg $\delta$ value of the resonator material ($\delta$ = loss angle).

A more precise structure of the filter is shown in FIGS. 1–7 which is an example of a four circuit filter and wherein.

Figure 1:
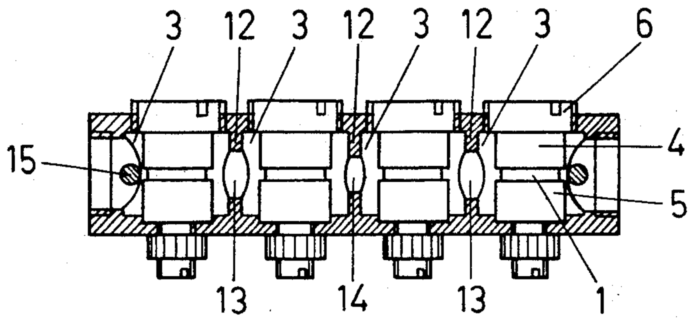
FIGS. 1 and 2 are longitudinal sections of a filter made according to the invention, the sections being taken at right angles to each other.

The four disk shaped resonators 1 are each situated in the center of equally spaced, bored-pockets 3, arranged in the filter housing 2 (preferably of a square profile) crosswise with respect to the filter axis. The diameter of said passages is about twice that of the disk diameter, the hole depth can be somewhat smaller, e.g. about 1.5 times the disk diameter. The support of the resonators with respect to the filter housing 2 is obtained through the insulating tubes 4 and 5 which have internal flanges at the connecting end for the resonator disk which serves for centering the disks. The insulating supports, accordingly, contact the disks only in the surroundings near the edges, so that the feed back over the resonator holder of the resonant frequency of the circuit is the smallest possible. The combination of resonator disk 1 and tubeform insulated supports 5 and 4 is finally pressed by means of screw 6 against the forward end of bored-pockets 3. The forward end as well as the screw 6 comprises centering cavities for the insulating holder, so that the position of the dielectric resonator is clearly fixed.

Figure 4:
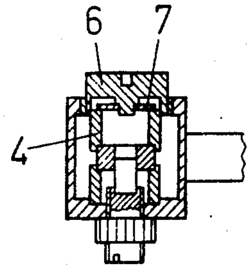
FIGS. 4–7 show cross-sections of modified forms of the device.

As a result of the simple design, the insulating supports 4 and 5 can be manufactured out of hard plastic, or sintered quartz or ceramic (material with relatively small $\epsilon_r$). For avoidance of the danger of breaking by the use of supports of ceramic materials, a plate spring or membrane 7 can be inserted between the insulating support 4 and the screw 6, as shown in FIG. 4. An additional centering of spring 7 with the screw 6 prevents the latter from coming into contact with the hole wall. Eventual changes in dimensions, e.g., as a result of temperature changes, will be automatically detected and made ineffectual by these measures. As a result of the relatively large cross-section of the insulating supports 4 and 5, they provide, besides, a relatively good heat conductor for the resonator, so that greater high frequency power can be transmitted with the filter. In extreme cases, a special heat conducting ceramic e.g. beryllium oxide (BeO, $\epsilon_r = 6.4$ and $\tau an\delta = 3.10^{-4}$) can be employed as the support material.

The apparatus for tuning the disk resonators is applied on the forward end of the boring 3 opposite the screw 6. This comprises an insulating holder 9 carrying the tuning element 8, which preferebly is made of the same material as the resonator, and the lock nut 10. For the purpose of attaining a greater tuning range, a hole 11 is formed in resonator through which the element 8 can be passed. The diameter of the core 8 corresponds to about the thickness of the resonator disk, its length at most about 1.5 times the disk thickness. With greater length, series or parallel resonance can occur. The core 8 is cemented in a small centered cavity in the insulating screw 9. The lock nut 10 is preferably made of metal. Thereby, the hole damping of the duct holes for the resonator tuner increases considerably and thus a field discharge over the insulating carrier 9 is practically avoided. With resonators comprising compacting screws, resonator mounting and tuning parts, a compact, mechanically simple unit is provided.

For attaining a desired filter characteristic, symmetrically decreasing coupling coefficients from the filter end towards the middle resonator are required (in case of symmetrical transmission). In order to obtain this coupling between the circuits, the distances between the borings 3 are so chosen according to the invention, that between them, thin intermediate separating walls 12 are retained. By drilling out these separating walls from the front of the filter housing, the respective necessary degree of coupling is established. The respective hole diameters (holes 13 and 14) decrease, in addition to being symmetrical, towards the middle of the filter, according to a certain mathematical relationship in such a manner that the desired filter characteristic is produced. This characteristic is determined by the number of filter elements, and the relative band width of the filters, as well as by the permissible pulsation factor of the selectivity curve. The respective necessary hole diameters can be predetermined relatively easily by known methods with the aid of a two circuit filter.

The coupling windows form here an integral constituent of the filter housing. They provide neither contact problems, nor make welding necessary. The respective coupling coefficients are exclusively determined by distance and diameter of the intersecting borings, the dimension sites of which can be determined very accurately. This construction operates especially well with filters with a high number of elements, e.g. six, because of the necessarily relatively small coupling coefficients in the filter center. Naturally, other coupling forms are also conceivable, e.g. by means of slots in the separating walls or metallic punchings in a filter housing formed of a square tube. As however tests have shown, this offers only an arrangement with the danger that the manufacture of exactly reproducible filters with clearly defined measurements will not be obtained.

The resonance excitation of the dielectric washer or disk results in the minimal possible oscillation type, viz., in $TE_{011}$ - (or $H_{011}$) mode, characterized by a circular E- field and a torroidal shaped H- field. Because of the smallness of the washer or disk in comparison to the operating wave length, λ, in free space, an electric excitation is practically not possible.

Figure 2:
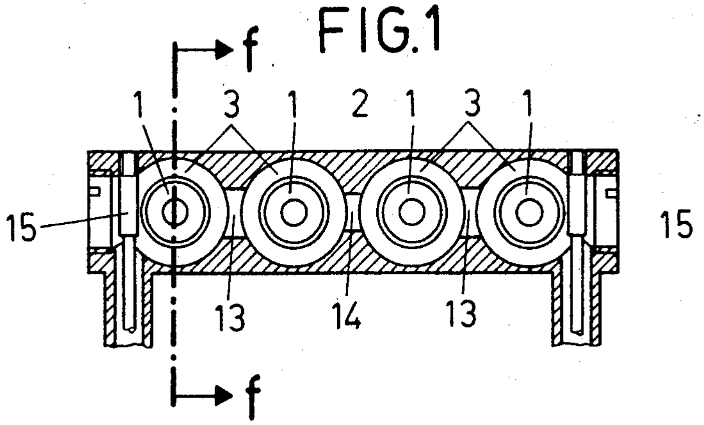
Figure 3:
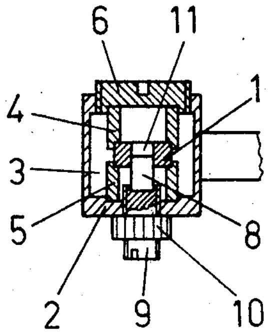
FIG. 3 is a cross-section taken on the plane f-f of FIG. 2.
Figure 5:
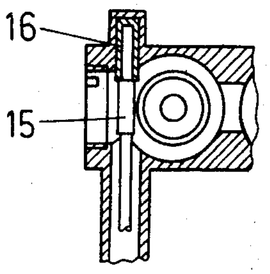

The intermediate circuit couplings of the resonators are therefore predominantly of the magnetic kind. Otherwise, only the inductive variant can be taken into consideration for the coupling of the first and last filter circuits to the filter supply line. In FIGS. 1 and 2, the filter supply lines are developed as coupling lines 15. The latter pass at right angles to the long axis of the filters so that, among other things, a simple mounting of the filters, e.g. on a printed plate is possible. The metallic connection of the conductor end with the filter housing can also be replaced by a capacitive connection 16, as shown in FIG. 5. The coupling is optimal when the maximum current of the filter supply line is directly in coupling range with the resonator. This feature is however, as tests have shown, not critical. Variations around $\pm \lambda/8$ of electrical length of the conductor end are quite permissible. The somewhat lower coupling coefficient in this case readily permits equalization through dimishing of the conductor distance to the resonator.

Figure 6:
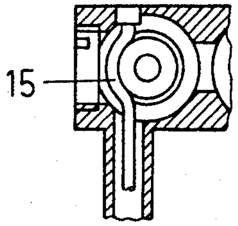
Figure 7:
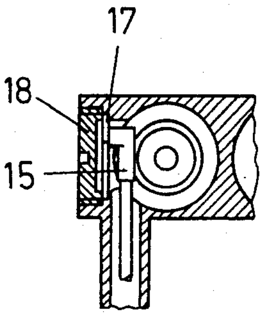

With filters with a high number of circuits, e.g. six, and relatively broad band, e.g. 1% of band middle frequency, a relatively close coupling of the resonator to the supply filter line, is, to be sure, necessary. In FIGS. 6 and 7, such coupling types are more precisely sketched. In FIG. 6, the coupling line 15 is partly parallel to the periphery of the resonating washer or disk, in FIG. 7, the inductive arm is connected with a metal washer 17 which in its turn is pressed by screw 18 toward the filter housing.

The coupling coefficient depends besides on the distance of the coupling line from the resonator and further on the ratio of the coupling loop impedance to the characteristic impedance of the filter supply lines. It has a relative maximum, when the loop impedance matches the characteristic impendace of the filter supply line. Between these two values there exists, accordingly, an optimizing problem, whereby either the loop impedance can be adjusted to the characteristic impedance or the latter, e.g. through a series of λ/4 transformers, can be adjusted to the loop impedance.

The inductive coupling of the filter supply line has a resonance detuning toward high frequencies at the first and last filter circuit of the series, the degree of which depends on the momentary coupling coefficient and the proportion of coupling line inductivity to the characteristic impendance of the filter supply line. According to the necessary filter qualities, this resonance detuning can carry up to several percent of the mean transmission frequency of the filters and therewith correspond to about the amount of the tuning range of the filters. In this case, practically the total tuning range for fine tuning of the first and last filter circuit is needed, so that then a thorough tuning would no longer be possible. In order to prevent this draw-back, it is proposed, according to the invention, that the coupling detuning of the first and last filter circuits should be connected directly at the relevant resonators, viz., to enlarge the diameter and/or thickness of those dielectric washers in such a way that the corresponding tuning plugs obtain about the same tuning position as is exhibited by the tuning plugs of the remaining resonators. The phase differences of the tuning plugs are then dependent only on the actual material and dimension tolerance of the dielectric resonators.

As a result of the discrete borings for the housings of the resonator provided according to the invention and the pronounced coupling windows, the direct field penetration can be kept very small, so that the stop band attenuation with broad frequency spacing of the filters practically correspond to the selection theoretically to be expected. Of course, the cavities for the dielectric washer together with the insulating studs, also exhibit certain inherent resonances. Such modes on which the resonator will be stimulated, lie here far above the frequencies coming into consideration. Besides, there is possible still a lower frequency mode characterized by an E- field in the axial direction of the insulating tube and a circular H- field in the transverse plane of the boring. However, excitation of these oscillating types is not possible, since these E- and H- components are perpendicular to that of the coupling circuit, which fact is of special advantage with the employment of ceramic supporting materials (relatively high $\epsilon_r$).

Typical dimensions of a dielectric four circuit filter for 8 GHz filter frequency which has been put into practice are:

| | |
|---|---|
| Resonator type | washer shape |
| Resonator material | Rutile ceramic |
| Washer diameter | 4.5 mm |
| Washer thickness | 2.0 mm |
| Diameter of tuner holder | 1.8 mm |

-continued

| | |
|---|---|
| Diameter of tuner core | 1.7 mm |
| Length of tuner core | 3.0 mm |
| Diameter of shield boring | 9.0 mm |
| Length of shield boring | 7.5 mm |
| Resonator interval | 10 mm |

With these dimensions, the tuning range amounts to about 3% of the middle band frequency. Greater range can be easily reached, e.g., through enlarging the diameter of the tuning elements, but that can have a deteriorating effect on the long-term stability of the filters (detuning individual circuits). The choice of these dimensions is therefore many times a compromise between desired tuning range and the permissible filter stability or the expenses added to manufacturing costs.

The slight thermal influence of shielding and resonator tuning on the resonating frequency can, if necessary, at least partly be used to compensate for the possible thermal resonance migration of the dielectric washer. For example, the filter housing can be made of Invar or Kovar in case this advantage results therewith. A complete mechanical compensation, to be sure, is significant only with dielectric materials with relative low temperature coefficients. With large temperature coefficients, the very steep alterations of the resonance frequency by increasing temperature should be counteracted by a just as steep influence of a compensation. This would mean a differential connection of two magnitudes, exhibiting a considerable value; as a rule, a balance can not altogether be established. Therefore, the resonator material, when complete mechanical compensation of resonance drift is required, must not surpass a certain value of the temperature coefficient with regard to $\epsilon_r$.

The invention makes possible a considerable reduction in size and cost of microwave filters, e.g. in directional beam apparatus. The design of the filter circuit is simple and for each circuit number exactly reproducible. As resonators, the dielectric washers are employed, whereby the TE fundamental resonance is stimulated. The resonance splitting is not observed. The next higher resonant frequency amounts to about 1.4 times the fundamental frequency, therebetween is situated the filter curve which is continuous and even. There are no attenuation dips, and the stopband attenuation of the filters with broad frequency spacing is very near to the theoretical stopband attenuation without frequency spacing. The filter is adapted to be easily built into circuits using strip lines and hybrid techniques.

LITERATURE INDEX

1. Microwave Bandpass Filters containing High-Q Dielectric Resonators, IEEE-Trans. MTT-16, No. 4 (April 1968), pp. 218–227.
2. Investigation of Microwave Dielectric Filters, US-Report No. 1 and 2 of July 1, 1963 to Sept. 30, 1963 and Oct. 1, 1963 to Dec. 31, 1963, indexed under No. AD 426,201 and AD 436,653.
3. Ditto: U.S.-Report No. 3 and 4 of Jan. 1, 1964–Mar. 31, 1964 and Apr. 1, 1964 – Aug. 31, 1964, indexed under No. AD 444,150 and AD 453,421.
4. A miniatue high-Q-bandpass-filter employing dielectric resonators, IEEE-Trans. MTT-16, No. 4 (April 1968), PP. 210–218.
5. Dielectric resonators and their use as microwave filters, Z. angew. Phys., 24 (1968) 3, pp. 142–147.

We claim:

1. In a filter for electromagnetic waves of the type having shielded dielectric resonators, an improved construction, comprising a tubular filter shield, a plurality of coupled dielectric resonators in said shield, and mechanical elements comprising partitions, each having an opening therein, for decreasing the coupling coefficient positioned between adjacent coupled dielectric resonators.

2. The filter as claimed in claim 1 wherein the coupled dielectric resonators are disk shaped and made of dielectric material, said disks being arranged along the length of the filter shield with the axes of the disks extending at right andles to the longitudinal axis of said shield.

3. The filter as claimed in claim 2, wherein the said dielectric resonator disks have a thickness about one-half of the diameter thereof.

4. The filter as claimed in claim 2 wherein said partitions divide the filter shield into several cavities in which said coupled dielectric resonator disks are held, said partitions being spaced equally along the longitudinal axis of the tubular shield.

5. The filter as claimed in claim 4 wherein said tubular filter shield has transversely bored pockets therein between the partitions, said pockets forming the cavities for holding the coupled dielectric resonator disks.

6. The filter as claimed in claim 5 wherein said bored pockets forming the cavities have a diameter approximately twice that of the coupled dielectric resonator disks, the depth of said cavities being about 1.5 times the diameter of the disks.

7. The filter as claimed in claim 4 comprising means for holding the coupled dielectric resonator disks in the center of the cavities.

8. The filter as claimed in claim 4 comprising insulating means to hold each of said dielectric resonator disks in its respective cavity.

9. The filter as claimed in claim 8 wherein said dielectric resonator disks are fastened in the center of their respective cavities by an insulating compound.

10. The filter as claimed in claim 8 wherein said insulating means for holding each of said dielectric resonator disks comprises a pair of insulating tubes arranged on opposite sides of the disk.

11. The filter as claimed in claim 10 wherein said insulating tubes exhibit interior centering flanges at the connection points with the dielectric resonator disks.

12. The filter as claimed in claim 10, wherein said cavities extend through a first side of the tubular shield, said tubular insulating means holding the dielectric resonator disks therebetween being fitted axially in their respective cavities and screw means fitting within said first side of said cavity for holding said tubular means on the dielectric resonator disks.

13. The filter as claimed in claim 12, wherein at least one of the screws in said first side of the tubular cavities is of metal and has a centering recess for the insulating tube and the second side of the boring (opposite the screw and the first side) is also of metal and has a centering recess for the insulating tube.

14. The filter as claimed in claim 10 wherein said insulating tubes are made of hard resinous material.

15. The filter as claimed in claim 10 wherein said insulating tubes are made of sintered quartz.

16. The filter as claimed in claim 10 wherein said insulating tubes are made of ceramic material.

17. The filter as claimed in claim 10 wherein said insulating tubes are made of beryllium oxide.

18. The filter as claimed in claim 12 comprising in addition a plate spring positioned between the screw and the adjacent insulating tube.

19. The filter as claimed in claim 10 comprising a tuning element positioned within at least one of the insulating tubes and wherein said dielectric resonator disks are in the form of washers with a hole in the center thereof.

20. The filter as claimed in claim 19, wherein said tuning element comprises an insulating threaded plug section with an insignificant dielectric constant extending to the outside of the housing and a short plug section made of material having high permittivity extending toward said washer.

21. The filter as claimed in claim 20 wherein the high permittivity material is of the same material as the washer.

22. The filter as claimed in claim 20 comprising means for shifting said plug in the direction of said washer, the central opening of said washer adapted to receive said plug.

23. The filter as claimed in claim 22, wherein the diameter of the central opening in said washer is approximately equal to the thickness thereof.

24. The filter as claimed in claim 20 wherein the length of the high permittivity plug section is approximately 1.5 times the thickness of the washer.

25. The filter as claimed in claim 20 comprising a lock nut connected to that portion of the plug extending outside the housing.

26. The filter as claimed in claim 5 wherein the distances between the borings for the coupled dielectric resonator disks and the diameters for said borings are so chosen that the partitions are formed between adjacent borings.

27. The filter as claimed in claim 1 wherein the partitions between the coupled dielectric resonators have holes bored in the central parts thereof, the size of said holes being such as to provide a predetermined filter curve.

28. The filter as claimed in claim 1 comprising means for inductively coupling the first and last of said coupled dielectric resonators to filter supply lines.

29. The filter as claimed in claim 4 comprising a coupling line having a portion extending within the filter shield, said portion extending generally perpendicularly to the axis of the filter shield and perpendicularly to the axial direction of the resonator cavities.

30. The filter as claimed in claim 29 wherein the internal winding of said input coupling line is galvanically connected to the filter housing.

31. The filter as claimed in claim 29 wherein said internal wiring portions of the input coupling line extend for a distance parallel to the periphery of the dielectric resonator disk.

32. The filter as claimed in claim 29 wherein the end of said internal winding portion of said coupling line is capacitively connected to the filter shield.

33. The filter as claimed in claim 32 wherein the capacitive connection to the filter shield is of such dimensions that the coupling range with respect to the resonator results in at least approximately a short circuit.

34. The filter as claimed in claim 29 wherein a series of quarter wave transformers are connected in series in the supply line for the coupling line.

35. The filter as claimed in claim 28 wherein the coupled dielectric resonators are disk shaped, the diameter and/or thickness of the dielectric resonator disks of the first and last filter elements compared with the measurements of the other coupled dielectric resonator disks are so much greater that they at least approximately offset resonance shifting to higher frequencies produced through inductive coupling of the filter supply line.

36. The filter as claimed in claim 1 wherein the filter shield is formed from a square tube and the mechanical elements for decreasing the coupling coefficient are formed of punched metal.

* * * * *